(12) United States Patent
Park et al.

(10) Patent No.: US 10,998,515 B2
(45) Date of Patent: May 4, 2021

(54) SOLAR CELL AND MANUFACTURING METHOD THEREFOR

(71) Applicant: IUCF-HYU, Seoul (KR)

(72) Inventors: Jea Gun Park, Seongnam-Si (KR); Tea Hun Shim, Suwon-Si (KR); Dal Ho Kim, Yeosu-Si (KR); Ji Heon Kim, Ulsan (KR); Jae Woo Shin, Cheongju-Si (KR); Joo Hyoung Park, Seoul (KR)

(73) Assignee: IUCF-HYU

( * ) Notice: Subject to any disclaimer, the term of this patent is extended or adjusted under 35 U.S.C. 154(b) by 58 days.

(21) Appl. No.: 15/028,420

(22) PCT Filed: Oct. 10, 2014

(86) PCT No.: PCT/KR2014/009513
§ 371 (c)(1),
(2) Date: Jul. 20, 2016

(87) PCT Pub. No.: WO2015/053578
PCT Pub. Date: Apr. 16, 2015

(65) Prior Publication Data
US 2016/0322592 A1     Nov. 3, 2016

(30) Foreign Application Priority Data

Oct. 10, 2013   (KR) .................. 10-2013-0120520
Feb. 18, 2014   (KR) .................. 10-2014-0018183

(51) Int. Cl.
*H01L 51/44*     (2006.01)
*H01L 51/00*     (2006.01)
*H01L 51/42*     (2006.01)

(52) U.S. Cl.
CPC ........ *H01L 51/447* (2013.01); *H01L 51/0001* (2013.01); *H01L 51/442* (2013.01);
(Continued)

(58) Field of Classification Search
CPC . H01L 51/00; H01L 51/0001; H01L 51/0021; H01L 51/0023; H01L 51/42;
(Continued)

(56) References Cited

U.S. PATENT DOCUMENTS 8,088,499 B1 * 1/2012 Wang .................. H01L 51/5088
428/690
2006/0278267 A1 * 12/2006 Miyazawa ........... H01G 9/2004
136/252
(Continued)

FOREIGN PATENT DOCUMENTS

CN   101023540 A   8/2007
CN   103140950 A   6/2013
(Continued)

OTHER PUBLICATIONS

English machine translation of Park et al. (KR 10-2010-0106779), published on Oct. 4, 2010.*
(Continued)

*Primary Examiner* — Christina Chern
(74) *Attorney, Agent, or Firm* — Renaissance IP Law Group LLP

(57) ABSTRACT

The present invention provides a solar cell and a method for manufacturing the same, the solar cell including a first electrode formed on a substrate, a nanocrystal layer including a plurality of nanocrystals formed on the first electrode so as to contact the first electrode, a hole transport layer formed on the first electrode so as to cover the plurality of nanocrystals, a photoactive layer formed on the hole transport layer, and a second electrode formed on the photoactive layer.

3 Claims, 9 Drawing Sheets

(52) U.S. Cl.
CPC ...... *H01L 51/0036* (2013.01); *H01L 51/0037* (2013.01); *H01L 51/0047* (2013.01); *H01L 51/0072* (2013.01); *H01L 51/0096* (2013.01); *H01L 51/4273* (2013.01); *Y02E 10/549* (2013.01)

(58) Field of Classification Search
CPC ..... H01L 51/44; H01L 51/441; H01L 51/445; H01L 51/447
See application file for complete search history.

(56) References Cited

U.S. PATENT DOCUMENTS

| | | | | |
|---|---|---|---|---|
| 2007/0194694 | A1* | 8/2007 | Reddy | B82Y 20/00 313/503 |
| 2010/0043861 | A1 | 2/2010 | Forrest et al. | |
| 2011/0297216 | A1 | 12/2011 | Ihn et al. | |
| 2013/0008509 | A1 | 1/2013 | Subbiah et al. | |
| 2013/0213477 | A1 | 8/2013 | Nakayama et al. | |
| 2013/0240867 | A1* | 9/2013 | Zhou | H01L 51/5206 257/40 |
| 2014/0137929 | A1* | 5/2014 | Yun | H01L 51/4253 136/255 |
| 2016/0087234 | A1* | 3/2016 | Song | H01L 51/426 136/256 |

FOREIGN PATENT DOCUMENTS

| | | | | |
|---|---|---|---|---|
| JP | 2006-237283 | * | 9/2006 | ............. H01L 51/42 |
| JP | 2012074569 | | 4/2012 | |
| JP | 2013508912 | A | 3/2013 | |
| KR | 100915530 | | 9/2009 | |
| KR | 20100106779 | | 10/2010 | |
| KR | 20110108154 | | 10/2011 | |
| KR | 20130107143 | | 10/2013 | |
| TW | 200840067 | A | 10/2008 | |
| WO | 2013063562 | A1 | 5/2013 | |
| WO | WO-2015115864 | A1 * | 8/2015 | ........... H01L 51/426 |

OTHER PUBLICATIONS

Definition of "longitudinal" retrieved from https://www.dictionary.com/browse/longitudinal on Oct. 8, 2018.*

Definition of "lateral" retrieved from https://www.dictionary.com/browse/lateral?s=t on Oct. 8, 2018.*

English machine translation of Takaguchi (JP 2006-237283) published Sep. 7, 2006.*

International Search Report, International Preliminary Report on Patentability and Written Opinion dated Jan. 15, 2015.

* cited by examiner

SOLAR CELL AND MANUFACTURING METHOD THEREFOR

TECHNICAL FIELD

The present invention relates to a solar cell and a method for manufacturing the same, and more particularly, to a solar cell and a method for manufacturing the same which are capable of improving photoelectric conversion efficiency.

BACKGROUND ART

Solar cells are photoelectric conversion elements for converting sun light into electric energy. Unlike other energy sources, solar cells are inexhaustible and environment-friendly and thus have become increasingly important over time. Typically, single crystalline or polycrystalline silicon solar cells are widely used as solar cells. However, there are problems in that silicon solar cells require a great manufacturing cost and may not be applied to flexible substrates, etc.

Recently, to solve the problems of silicon solar cells, research on organic solar cells is being actively carried out. An organic solar cell has a basic structure in which an organic photoactive layer is formed between first and second electrodes which are spaced apart from each other. Korean Patent application Laid-open Publication No. 10-2010-0106779 discloses an example of this organic solar cell. Organic solar cells can be manufactured through a method such as spin coating, inkjet printing, roll coating or a doctor blade method. Thus, organic solar cells have merits of a simple manufacturing process and low manufacturing costs, and have merits in that a wide area can be coated, a thin film can be formed at a low temperature, and almost all kinds of substrates such as a glass substrate or a plastic substrate can be used. Also, organic solar cells can be manufactured in various shapes such as a plastic molding articles, curved surfaces or spherical surfaces without being limited in shapes of substrates. Using these merits, organic solar cells are convenient to use by being attached to clothes, bags, or the like, of people, or by being attached to a portable electronics products. In addition, polymer blend thin films have high light transparency and thereby provide an outside view by being attached to glass windows of buildings or cars, and are also capable of producing electricity, and thus have a much broader application range than opaque silicon solar cells.

In organic solar cells, light incident through a transparent electrode (ITO) is absorbed into electron donors inside a bulk hetero junction photoactive layer which is formed of electron donors and electron acceptors. Here, excitons each of which is a pair of an electron and a hole are formed, and separation occurs at the interfaces of the electron donors and electron acceptors. Separated electrons and holes respectively move to a negative electrode and a positive electrode, and an exciton and hole blocking layer is formed to prevent excitons and holes from moving to the negative electrode. Also, after forming an interface layer which functions to inject electrons and to lower an energy band, the negative electrode is formed. In typical organic solar cells, most of incident light is absorbed by electron donors, but there is a limitation in that only approximately 60% of the incident light can be absorbed, and thus an increase in a light absorption rate is demanded. Thus, irrespective of various merits, organic solar cells are not suitable to be applied to an actual application due to low photoelectric conversion efficiency caused by a low absorption rate.

DISCLOSURE OF THE INVENTION

Technical Problem

The present invention provides a solar cell and a method for manufacturing the same which are capable of improving photoelectric conversion efficiency.

The present invention also provides a solar cell and a method for manufacturing the same which are capable of improving photoelectric conversion efficiency by using an internal surface plasmon resonance effect.

Technical Solution

In accordance with an exemplary embodiment, a solar cell includes: a first electrode formed on a substrate; a nanocrystal layer including a plurality of nanocrystals formed on the first electrode so as to contact the first electrode; a hole transport layer formed on the first electrode so as to cover the plurality of nanocrystals; a photoactive layer formed on the hole transport layer; and a second electrode formed on the photoactive layer.

The solar cell may further include an exciton and hole blocking layer and an electron injection and interface layer which are formed between the photoactive layer and the second electrode.

The exciton and hole blocking layer may be formed by using BCP or a metal oxide.

The electron injection and interface layer may be formed of at least any one of LiF, CsF, $LiCoO_2$, and $Cs_2CO_3$.

The nanocrystal layer may be formed of a material having a light reflectance of 50% or more.

The nanocrystal layer may be formed in a thickness of 1 nm to 15 nm.

The nanocrystals may be formed to have a long axis having a length of 15 nm to 45 nm, and to have a short axis having a length of 8 nm to 17 nm.

The nanocrystals each may have a contact distance with the first electrode, the contact distance being shorter than a length of an axis parallel thereto.

The nanocrystals each may be formed to have an average diameter of 15 nm to 45 nm, and to have an average spacing distance of 25 nm to 75 nm between nanocrystals adjacent to each other.

The hole transport layer may be formed of at least any one of $MoO_x$, $V_2O_5$, $VO_x$, $WO_3$, $NiO_x$, $Cu_2O$.

The photoactive layer may include a bulk heterojunction electron donor and a bulk heterojunction electron acceptor.

In accordance with an exemplary embodiment, a method for manufacturing a solar cell includes: forming a first electrode on a substrate; forming a nanocrystal layer including a plurality of nanocrystals on the first electrode; forming a hole transport layer on the first electrode so as to cover the nanocrystals; forming a photoactive layer by applying a material, in which electron donors and electron acceptors are mixed, on the hole transport layer; and forming a second electrode on the photoactive layer.

The method for manufacturing a solar cell may further include performing at least any one of plasma treatment and ultraviolet treatment on the substrate before the forming of the nanocrystal layer.

The method for manufacturing a solar cell may further include forming an exciton and hole blocking layer and an electron injection and interface layer between the photoactive layer and the second electrode.

The nanocrystal layer may be formed in a thickness of 5 nm to 8 nm.

The nanocrystals each may be formed to have a long axis having a length of 15 nm to 45 nm, and to have a short axis having a length of 8 nm to 17 nm.

The nanocrystals each may have a contact distance with the first electrode, the contact distance being shorter than a length of an axis parallel thereto.

The nanocrystals each may be formed to have an average diameter of 15 nm to 45 nm, and to have an average spacing distance of 25 nm to 75 nm between nanocrystals adjacent to each other.

Advantageous Effects

In accordance with a solar cell of an exemplary embodiment, a nanocrystal layer which contacts a first electrode and includes a plurality of nanocrystals is formed on the first electrode on a substrate. An electric field is amplified by a surface plasmon effect due to the plurality of nanocrystals, and light is scattered while passing through the nanocrystals and an amount of light is amplified. Thus, since the amount of light supplied to a photoactive layer is increased, absorption of light at the photoactive layer can be increased, and thus photoelectric conversion efficiency can be improved.

MODE FOR CARRYING OUT THE INVENTION

Hereinafter, embodiments of the present invention will be described in detail with reference to the accompanying drawings. The present invention may, however, be embodied in different forms and should not be construed as limited to the embodiments set forth herein. Rather, these embodiments are provided so that this invention will be thorough and complete and will fully convey the scope of the present invention to those skilled in the art.

Figure 1:
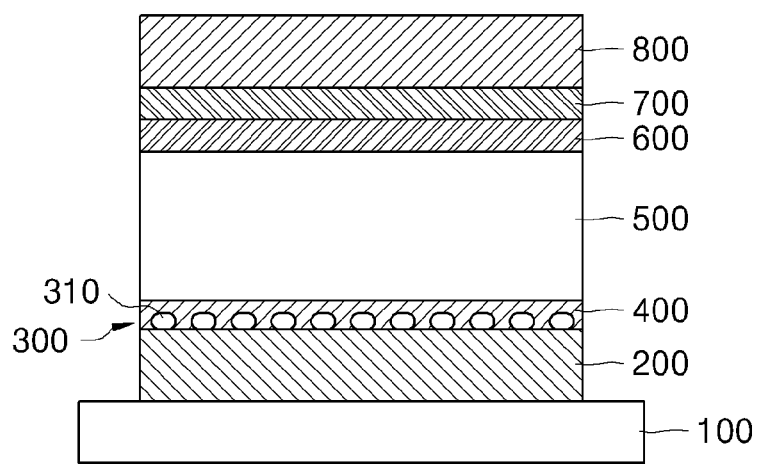
FIG. 1 is a cross-sectional view illustrating a solar cell in accordance with an embodiment of the present invention.
Figure 2:
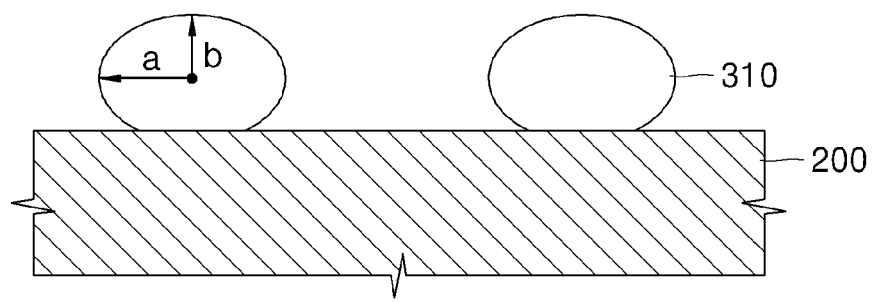
FIG. 2 is a cross-sectional view in accordance with the present invention.
Figure 3:
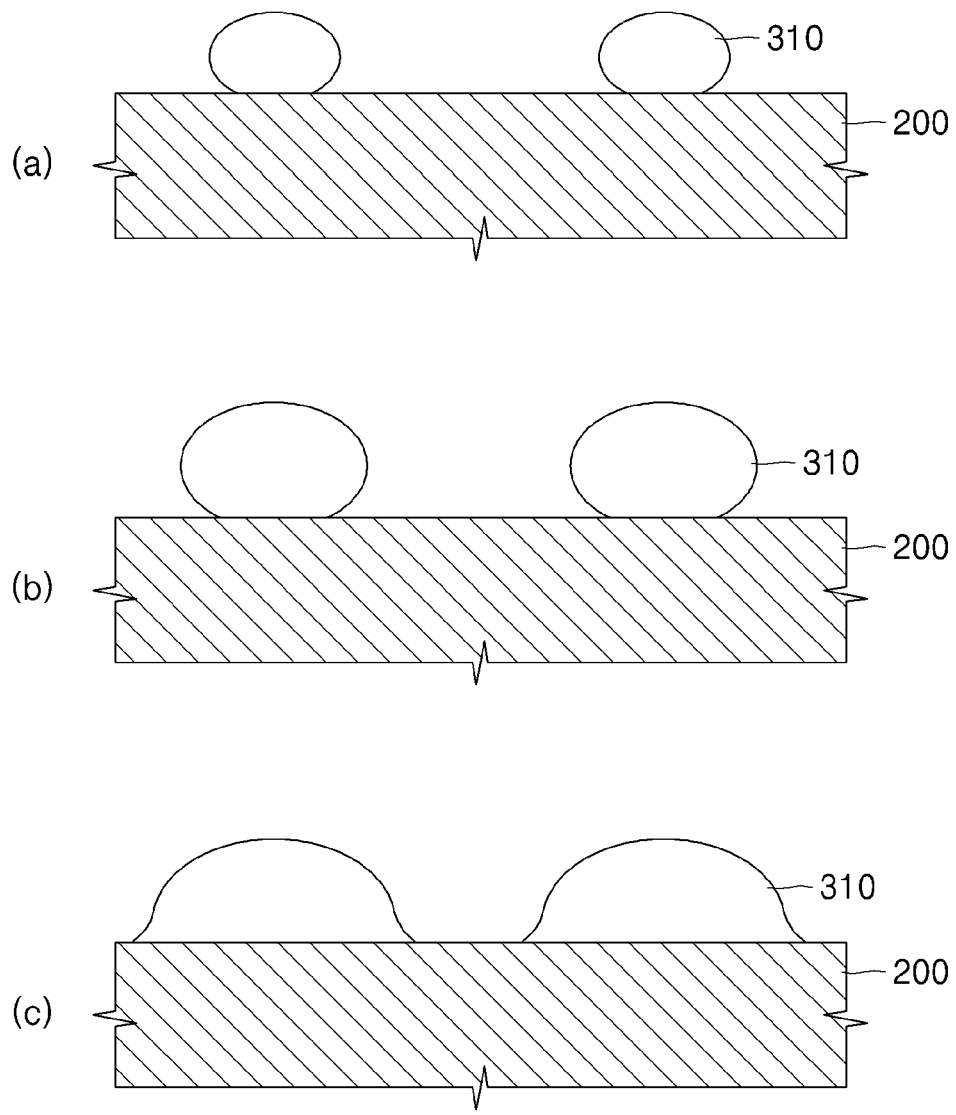
FIG. 3 is a cross-sectional view for illustrating a change in a shape of a nanocrystal in accordance with a deposited thickness of a nanocrystal layer.
Figure 4:
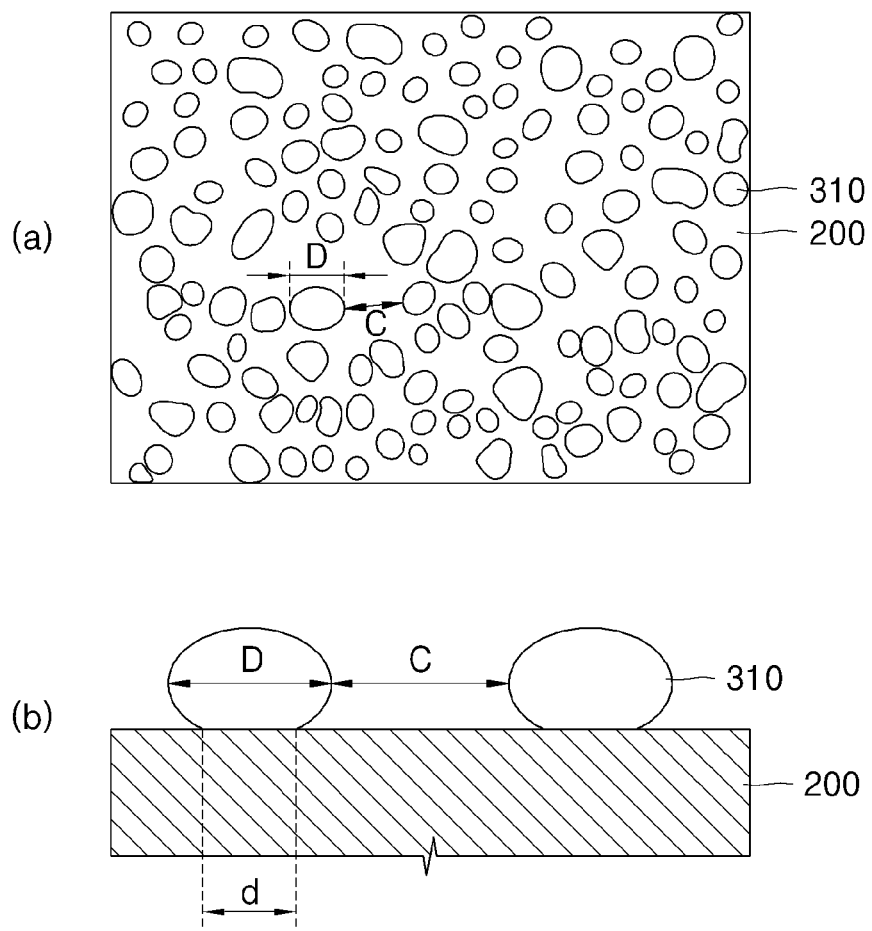
FIG. 4 is a plan view and an associated cross-sectional view of a nanocrystal.

FIG. 1 is a cross-sectional view illustrating a solar cell in accordance with an embodiment of the present invention, and FIGS. 2 to 4 are a cross-sectional view and a plan view of a nanocrystal applied in the present invention.

Referring to FIG. 1, a solar cell in accordance with an embodiment of the present invention includes: a substrate 100; a first electrode 200 formed on the substrate 100; a nanocrystal layer 300 including a plurality of nanocrystals 310 formed on the first electrode 200; a hole transport layer 400 formed on the first electrode 200 including the nanocrystal layer 300; a photoactive layer 500 formed on the hole transport layer 400; an exciton and hole blocking layer 600 formed on the photoactive layer 500; an electron injection and interface layer 700 formed on the exciton and hole blocking layer 600; and a second electrode 800 formed on the electron injection and interface layer 700. Here, the second electrode 800 may also be formed on the photoactive layer 500 without forming the exciton and hole blocking layer 600 and the electron injection and interface layer 700. That is, in a solar cell in accordance with an embodiment of the present invention, the first electrode 200, the nanocrystal layer 300, the hole transport layer 400, the photoactive layer 500, and the second electrode 800 may be formed by being laminated in at least one region on the substrate 100, and the exciton and hole blocking layer 600 and the electron injection and interface layer 700 may also be further provided between the photoactive layer 500 and the second electrode 800.

A transparent substrate may be used for the substrate 100, and the transparent substrate having a transmittance of at least 70% or more, preferably, 80% or more within a wavelength band of visible light may be used. For example, as the substrate 100, a transparent organic substrate formed of quartz, glass, or the like may be used, and a plastic substrate formed of polyethylene terephthalate (PET), polyethylene naphthalate (PEN), polycarbonate (PC), polystyrene (PS), polypropylene (PP), polyimide (PI), polyethylene sulfonate (PES), polyoxymethylene (POM), AS resin, ABS resin, or the like may also be used.

The first electrode 200 is formed on at least one region on the substrate 100. Since the first electrode 200 serves as a path through which light passing through the substrate 100 reaches the photoactive layer 500, the first electrode 200 may be preferably formed of a highly transparent material. To this end, the first electrode 200 may be formed by using, for example, indium tin oxide (ITO), gold, silver, tin oxide doped with florin (FTO), $ZnO$—$Ga_2O_3$, $ZnO$—$Al_2O_3$, $SnO_2$—$Sb_2O_3$, or the like. However, the embodiment of the inventive concept is not limited thereto, and transparent conductive materials may be used for the first electrode 200.

The nanocrystal layer 300 including a plurality of nanocrystals 310 is formed on the first electrode 200. That is, a plurality of nanocrystals 310 are formed to contact a surface of the first electrode 200. These nanocrystals 310 may be formed of a material having a high light reflectance, for example, a material having a light reflectance of 50% or more. Here, the light reflectance means a ratio of an amount of reflected light to an amount of light incident to a metal. Such materials having high light transmittance include, for example, silver, gold, aluminum, copper, nickel, iron, titanium or alloys thereof, calcium/aluminum alloy, magnesium/silver alloy, aluminum/lithium alloy, or the like, but the embodiment of the present invention is not limited thereto. A surface plasmon resonance due to nanocrystals 310 is generated by providing the plurality of nanocrystals 310. The surface plasmon resonance is a collective oscillation phenomenon of a metal having a negative dielectric function ($\epsilon'<0$), that is, a medium having a positive dielectric function ($\epsilon'>0$) with the nanocrystals 310, that is, conduction band electrons propagating along an interface of the first electrode 200. The electric field strength on a surface is amplified by the surface plasma resonance due to nanocrystals 310, and light absorption in the photoactive layer 500 may thereby be increased to improve photoelectric conversion efficiency. In addition, the nanocrystals 310 are formed of a highly reflective material, so that light is scattered while passing through the nanocrystals 310, and thus an amount of light is increased. Since the amount of light is increased while passing through the nanocrystals 310, light absorption in the photoactive layer 500 may be increased, and thus the photoelectric conversion efficiency may be improved. That is, since the amount of light supplied to the photoactive layer 500 may be increased by the surface plasmon resonance and light scattering due to the plurality of nanocrystals 310 formed on the first electrode 200, and thus the photoelectric conversion efficiency may be improved. The nanocrystal layer 300 including a plurality of nanocrystals 310 in accordance with the present invention will be described later in detail.

The hole transport layer 400 including the nanocrystal layer 300 including the plurality of nanocrystals 310 is formed on the first electrode 200. That is, the hole transport layer 400 is formed on the first electrode 200 so as to over the plurality of nanocrystals 310. The hole transport layer 400 allows the holes separated from the photoactive layer 500 to reach the first electrode 200. Thus, the hole transport layer 400 may be formed by using materials facilitating the movement of the holes. For example, for the hole transport layer 400, a conductive polymer or the like, such as, poly(3,4-ethylenedioxythiophene) (PEDOT), poly(styrenesulfonate) (PSS), polyaniline, phthalocyanine, pentacene, polydiphenylacetylene, poly(t-butyl)diphenylacetylene, poly(trifluoromethyl)diphenylacetylene, Cu—PC(copper phthalocyanine) poly(bistrifluoromethyl)acetylene, polybis (T-butyldiphenyl) acetylene, poly(trimethylsilyl)diphenylacetylene, poly(carbazole)diphenylacetylene, polydiacetylene, polyphenylacetylene, polypiridineacetylene, polymethoxyphenylacetylene, polymethylphenylacetylene, poly(t-butyl) phenylacetylene, polynitrophenylacetylene, poly(trifluoromethyl)phenylacetylene, poly(trimethylsilyl) phenylacetylene, or derivatives thereof can be used as one polymer or a combination of two or more polymers thereof. Preferably, the hole transport layer 400 may be formed by using a mixture of PEDOT-PSS. In addition, the hole transport layer 400 may be formed of an oxide-based material, for example, at least any one of $MoO_x$, $V_2O_5$, $VO_x$, $WO_3$, $NiO_x$, or $Cu_2O$.

The photoactive layer 500 is formed on the hole transport layer 400, and a material in which electron donors and electron acceptors are blended can be applied through a method such as spin coating. The light incident through the first electrode 200 from the outside is amplified by the plurality of nanocrystals 310 and is absorbed by electron donors formed in the photoactive layer 500. Also, non-absorbed light is reflected from the second electrode 800 and is absorbed again by the electron donors. Here, the light which is not absorbed again may be reflected again by the nanocrystals 310 and absorbed again in the photoactive layer 500. Accordingly, since the light incident from the outside is amplified and reflected, the light absorption rate in the photoactive layer 500 is increased. As the electron donors, any one or two kinds of materials of conductive polymers including P3HT(poly(3-hexylthiopene)), polysiloxane carbazole, polyaniline, polyethylene oxide, (poly(1-methoxy-4-(0-Disperse Red 1)-2,5phenylene-vinylene), polyindole, polycarbazole, polypyridiazine, polyisothianaphthalene, polyphenylene sulfide, polyvinylpyridine, polythiophene, polyfluoren, polypyridine, or derivatives thereof or the like may be mixed to be used. Also, as the electron acceptors, fullerene or fullerene derivatives may be used. Preferably, in the photoactive layer 500, a mixture of P3HT as an electron donor and [6,6]-phenyl-C61 butyric acid methyl ester (PCBM) as a fullerene derivative may be used. Here, P3HT and PCBM may be mixed at a weight ratio of 1:0.1 to 2:1. This photoactive layer 500 may be formed by using a method such as spraying, spin coating, dipping, printing, doctor blading, or sputtering.

The exciton and hole blocking layer 600 is formed on the photoactive layer 500 and prevents the holes which are separated in the photoactive layer 500, and the excitons which are not separated in the photoactive layer 500, from being moved to the second electrode 800 and recombined. The exciton and hole blocking layer 600 may be formed by using, for example, a material having a greater highest occupied molecular orbital (HOM) energy level, such as bathocuproine (BCP). Also, the exciton and hole blocking layer 600 may also be formed by using a metal oxide, for example, at least any one of $TiO_x$, ZnO, $Al_2O_3$ or CaO.

The electron injection and interface layer 700 allows electrons separated from excitons to be easily injected into the second electrode 800, improves interface characteristics between the photoactive layer 500 or the exciton and hole blocking layer 600 and the second electrode 800, and may be formed by using an alkali metal compound. For example, the electron injection and interface layer 700 may be formed by using LiF, CsF, $LiCoO_2$, $Cs_2CO_3$, or the like.

The second electrode 800 is formed on the electron injection and interface layer 700. The second electrode 800 may be formed by using a material having a high reflectance and a small resistance in order that the light which is incident through the first electrode 200 but is not absorbed in the photoactive layer 500 is absorbed again. As a material for the second electrode 800, a material having a work function lower than the material of the first electrode 200 may be used, for example, the material may include a metal such as magnesium, calcium, sodium, potassium, titanium, indium, yttrium, lithium, aluminum, silver, tin, or lead, or alloys thereof.

Referring to FIGS. 2 to 4, nanocrystals in accordance with the present invention will be described in detail. FIG. 2 is a conceptual cross-sectional view in accordance with the present invention, FIG. 3 is a conceptual cross-sectional view for illustrating a change in a shape of a nanocrystal in accordance with a deposited thickness of a nanocrystal layer, and FIG. 4 is a conceptual plan view and a conceptual cross-sectional view of a nanocrystal.

Referring to FIGS. 2 to 4, the nanocrystal layer 300 may be formed in a thickness of 1 nm to 15 nm to obtain a surface plasmon effect due to nanocrystals 310. That is, the nanocrystal layer 300 may be formed through, for example, a thermal evaporation method, and the nanocrystal layer 300 may be formed such that the thickness measured or set by using a thickness measuring device is 1 mm to 15 mm. The thickness measuring device including a crystal sensor is provided inside a chamber and a thickness may be detected by the vibration of the sensor due to a deposition thickness. Also, the thickness may be detected through an optical analysis such as SEM or TEM. The thickness of the nanocrystal layer 300 may be set by using supplied DC power, deposition time, a deposition speed, or the like. However, when the size of each nanocrystal 310 is measured after forming the nanocrystal layer 300 in this thickness, the nanocrystal 310 is formed, as illustrated in FIG. 2, to have a length in one direction, that is, to have a length of a long axis 'a' of 6 nm to 160 nm, and to have a length in the other direction crossing the one direction, that is, to have a length of a short axis 'b' of 5 nm to 30 nm. That is, when the nanocrystals 310 are measured after the nanocrystal layer 300 is formed in a predetermined thickness, the nanocrystals 310 may be formed greater than the thickness of the nanocrystal layer 300. Here, the long axis 'a' is illustrated in the lateral direction, and the short axis 'b' is illustrated in the longitudinal direction, but the relatively long direction may be the direction of the long axis 'a' and the relatively short direction may be the direction of the short axis 'b'. That is, each of the nanocrystals 310 may also be provided as a spherical shape having the long axis 'a' and the short axis 'b' which have the same lengths as each other, and may be provided as an ellipse having the long axis 'a' with the length longer than that of the short axis 'b'. The nanocrystal layer 300 is preferably formed in a thickness of 5 nm to 8 nm, and each of the nanocrystals 310 at this time may be formed such that the length of the long axis 'a' is 15 nm to 45 nm and the length of the short axis 'b' is 8 nm to 17 nm. That is, the thicker the thickness of the nanocrystal layer 300, the greater the size of each nanocrystal 310 may be. However, Since optical loss is small and external quantum efficiency is high when the nanocrystal layer 300 is formed in a thickness of 5 nm to 8 nm, and each nanocrystal 310 is formed to have the length of the long axis 'a' of 15 nm to 45 nm, and to have the length of the short axis 'b' 8 nm to 17 nm, this is preferable.

In addition, in the nanocrystal layer 300, the dot-shaped nanocrystals 310 are formed, and the shape of the nanocrystal layer 300 is changed into an island shape while the size of each nanocrystal 310 is increased as the deposition thickness is increased. When the thickness is further increased, a layer is formed. That is, as illustrated in FIG. 3(a), as the dot-shaped nanocrystals 310 are formed on the first electrode 200, and as the deposition thickness is increased, contact areas with the first electrode 200 are increased as illustrated in FIG. 3(b), and thereby the sizes of the nanocrystals 310 are increased. Also, as illustrated in FIG. 3(c), a contact area with the first electrode 200 has an island shape greater than the length of the long axis of each nanocrystal 310. Here, when the size of each nanocrystal 310 is further increased, the nanocrystals 310 form a layer while being combined with each other.

In addition, when the nanocrystal layer 300 is formed in a thickness of 1 nm to 15 nm, the nanocrystals 310 may be formed to have the average diameter 'D' of 7 nm to 160 nm, to have the average spacing distance 'C' of 20 nm to 180 nm between the nanocrystals 310 adjacent to each other, and to have the density of the nanocrystals 310 of 25 to 1800. Preferably, when the nanocrystal layer 300 is formed in a thickness of 5 nm to 8 nm, the nanocrystals 310 may be formed to have the average diameter 'D' of 15 nm to 45 nm, to have the average spacing distance 'C' of 25 nm to 75 nm between the nanocrystals 310 adjacent to each other, and to have the density of the nanocrystals 310 of 170 to 1100. Here, as illustrated in FIG. 4, the average diameter 'D' of the nanocrystals 310 may be greater than the contact distance 'd' with the first electrode 200. Since the nanocrystals 310 are formed on the first electrode 200 to contact the first electrode, a contact distance with the first electrode 200 is greater than 0. That is, the contact distance 'd' with the first electrode 200 of each nanocrystal 310 may be greater than 0 and smaller than the average diameter 'D' of the nanocrystals 310. However, when the contact distance 'd' of each nanocrystal 310 is greater than the average diameter 'D', the nanocrystals 310 are formed in island shapes as illustrated in FIG. 3(c), and thus this case is not preferable because of great optical loss and low external quantum efficiency.

As described above, in the solar cells in accordance with embodiments of the present invention, the nanocrystal layer 300 including a plurality of nanocrystals 310 and contacting the first electrode 200 is formed on the first electrode 200. An electric field is amplified by the surface plasmon effect due to a plurality of nanocrystals 310, and is supplied to the photoactive layer 500, and an amount of light is amplified by light scattering due to a plurality of nanocrystals 310 having high reflectance and is supplied to the photoactive layer 500. Accordingly, absorption of light in the photoactive layer may be increased, and thus photoelectric conversion efficiency may be improved. That is, external quantum efficiency may be improved by approximately 30% in comparison with the case in which the nanocrystals 310 are not formed.

Figure 5:
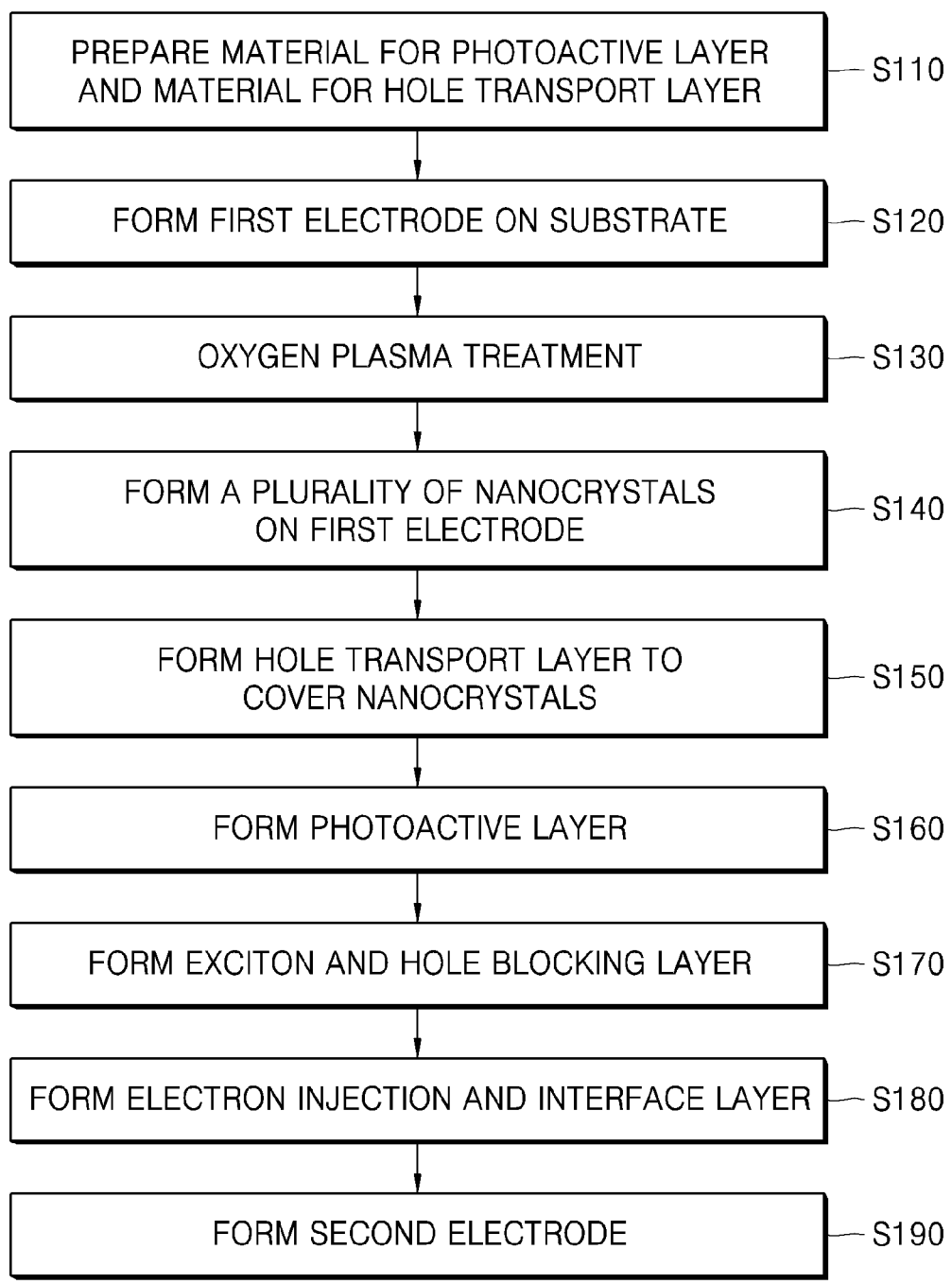
FIG. 5 is a process flowchart for illustrating a method for manufacturing a solar cell in accordance with an embodiment of the present invention.

FIG. 5 is a process flowchart for illustrating a method for manufacturing a solar cell in accordance with an embodiment of the present invention.

Referring to FIG. 5, materials for a photoactive layer and materials for hole transport layer are prepared (S110). To prepare materials for the photoactive layer, electron donors and electron acceptors are mixed into a predetermined solvent with a predetermined ratio. For example, P3HT and PCBM are mixed at a weight ratio of 1:0.1 to 2:1, the mixture thereof is then mixed into 1,2 dichlorobenzene at a weight ratio of 1 to 5, and then the resultant is blended for at least 72 hours. Thus, the material for the photoactive layer may be prepared. Here, besides 2-chlorobenzene, chlorobenzene, benzene, chloroform or THF may be used as the solvent. Also, to prepare the materials for the hole transport layer, for example, PEDOT-PSS and isopropyl alcohol (IPA) may be blended for at least 24 hours at a weight ratio of 1:2.

Next, a first electrode is formed on a substrate (S120). A transparent substrate having a transmittance of at least 70% or more, preferably, 80% or more within a wavelength band of visible light may be used as the substrate. Also, the first electrode may be formed by patterning after a transparent conductive material such as ITO is provided on the substrate. After the first electrode is formed, the substrate may be cleaned by using acetone or the like. The cleaning may be performed, for example, for 10 minutes to 100 minutes, and after the cleaning, drying may be performed for 5 hours to 15 hours at a temperature of 50° C. to 100° C. Besides acetone, isopropyl alcohol, distilled water (DI) may be used to clean the substrate.

Next, an oxygen plasma treatment is performed on the substrate, and then an ultraviolet treatment with a wavelength of 365 nm may be performed (S130). Here, only any one of the plasma treatment and the ultraviolet treatment may be performed. The plasma treatment is performed to smoothen the surface roughness of the first electrode and to increase the work function of the first electrode. Also, the ultraviolet treatment is performed to remove organics remaining on the surface of the first electrode even after the cleaning step.

Next, a nanocrystal layer including a plurality of nanocrystals is formed on the substrate on which the first electrode is formed (S140). The nanocrystal layer may be formed by using a metal including silver (Ag) having a high reflectance. Also, the nanocrystal layer may be formed through a thermal deposition under a vacuum state. Here, the nanocrystal layer may be formed at a rate of, for example, 0.1 Å/sec to 2.0 Å/sec in accordance with a deposition thickness, deposition time, or the like. The nanocrystal layer may be formed through various methods besides an evaporation method, for example, may also be formed through a sputtering method, an E-beam method, a coating method, or the like. The nanocrystal layer formed as described above may be formed in a thickness of, for example, 1 nm to 15 nm, preferably, 5 nm to 8 nm. That is, the nanocrystal layer may be formed such that a thickness measured or set through a thickness measuring device or an optical analysis is 1 nm to 15 nm, preferably, 5 nm to 8 nm. Here, each nanocrystal is formed such that the length of the long axis 'a' is 6 nm to 160 nm, and the length of the short axis 'b' of is 5 nm to 30 nm. Preferably, the length of the long axis 'a' is formed to be 15 nm to 45 nm, and the length of the short axis 'b' of is formed to be 8 nm to 17 nm. Also, the nanocrystals are formed to have the average diameter 'D' of 7 nm to 160 nm, preferably, 15 nm to 45 nm, to have the average spacing distance 'C' of 20 nm to 180 nm between the nanocrystals adjacent to each other, preferably, 25 nm to 75 nm, and to have the density of the nanocrystals of 25 to 1800, preferably, 170 to 1100.

Next, a hole transport layer is formed on the first electrode so as to cover the plurality of nanocrystals (S150). The hole transport layer may be formed in such a way that a hole transport layer material, in which PEDOT-PSS and IPA are blended, is spin-coated, for example, for 60 seconds to 300 seconds with a speed of 1000 rpm to 3000 rpm, and is then annealed for 10 minutes to 100 minutes under nitrogen atmosphere. That is, in accordance with the thickness of the hole transport layer, the time and the number of rotations of the spin coating, and the temperature and the time of the annealing may be adjusted.

Next, a photoactive layer is formed on the hole transport layer (S160). The photoactive layer may be formed in such a way that the photoactive layer material, in which P3HT and PCBM are mixed into 2-chlorobenzene, is spin-coated for 60 seconds to 300 seconds with a speed of 500 rpm to 2000 rpm, and is then annealed for 10 minutes to 100 minutes under nitrogen atmosphere. That is, in accordance with the thickness of the photoactive layer, the time and the number of rotations of the spin coating, and the temperature and the time of the annealing may be adjusted.

Next, an exciton and hole blocking layer is formed by depositing bathocuproine (BCP) in a thickness of 6 nm on the photoactive layer by using a deposition machine (S170), an electron injection and interface layer is then formed by depositing lithium fluoride (LiF) in a thickness of 0.5 nm on the exciton and hole blocking layer (S180), and a second electrode is formed by depositing aluminum (Al) in a thickness of 80 nm (S190).

EXAMPLE

P3HT and PCBM were mixed at a weight ratio of 2:1, the mixture was then mixed into 1,2 dichlorobenzene with 2 wt % and was then blended for 72 hours to prepare a photoactive layer material. Also, the photoactive layer material was prepared by blending PEDOT-PSS and IPA at a weight ratio of 1:2 for 24 hours.

Then, a first electrode was formed on the transparent substrate by using ITO, and a nanocrystal layer including a plurality of nanocrystals was then formed on the first electrode by depositing silver (Ag) on the first electrode. Here, the nanocrystal layers were formed with a deposition speed of 0.3 Å/sec, and respectively formed on a plurality of substrates in thicknesses of 3 nm to 15 nm. Subsequently, a hole transport layer was formed in such a way that a hole transport layer material, in which PEDOT-PSS and IPA were blended, was spin-coated, for example, for 60 seconds with a speed of 2000 rpm so as to cover the plurality of nanocrystals, and was then annealed for 10 minutes under nitrogen atmosphere. Then, a photoactive layer was formed in such a way that a photoactive layer material, in which P3HT and PCBM were mixed into 1,2 dichlorobenzene, was spin-coated, for example, for 60 seconds with a speed of 1000 rpm, and was then annealed for 10 minutes under nitrogen atmosphere. Then, an exciton and hole blocking layer was formed by depositing bathocuproine (BCP) in a thickness of 6 nm, an electron injection and interface layer was then formed by depositing lithium fluoride (LiF) in a thickness of 0.5 nm, and a second electrode was then formed by depositing aluminum (Al) in a thickness of 80 nm.

Figure 6:
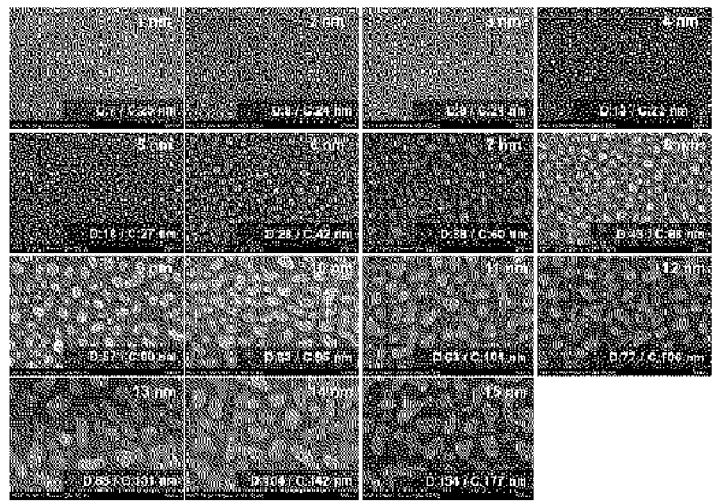
FIG. 6 is an SEM image illustrating a shape of a nanocrystal in accordance with a thickness of a nanocrystal layer.
Figure 7:
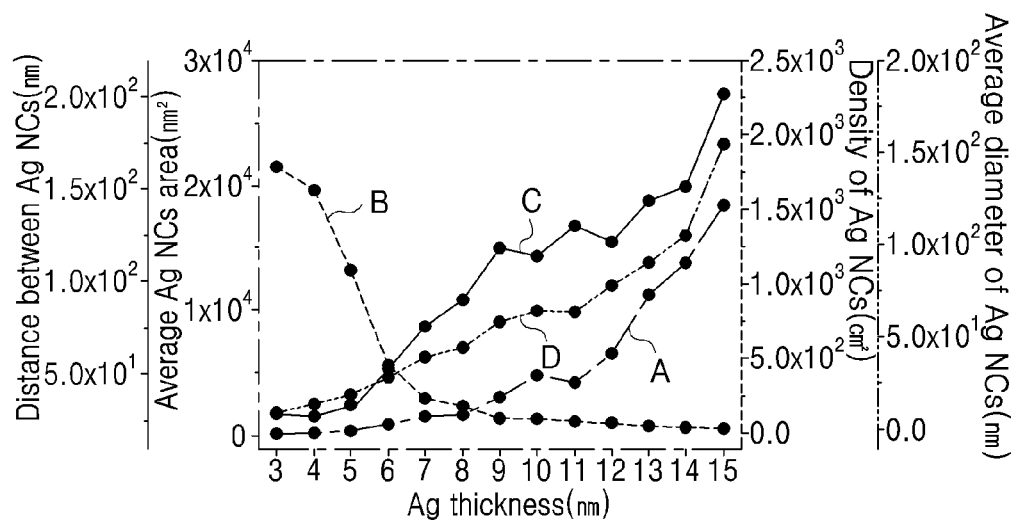
FIG. 7 is a graph illustrating an average area, a density, a spacing distance, and a change in an average diameter of nanocrystals in accordance with a thickness of a nanocrystal layer.

FIG. 6 is an SEM image illustrating a shape of a nanocrystal in accordance with a thickness of a nanocrystal layer. Also, FIG. 7 is a graph illustrating an average area, a density, a spacing distance, and a change in an average diameter of nanocrystals in accordance with a thickness of a nanocrystal layer.

As illustrated in FIG. 6, it can be understood that each nanocrystal grows from a dot shape in accordance with the thickness of the nanocrystal layer of 3 nm to 8 nm, and from 9 nm, the size of the nanocrystal is increased to grow into an island shape and the nanocrystal contacts another nanocrystal adjacent thereto to grow. Also, as illustrated in FIG. 7, it can be understood that as the thickness of the nanocrystal layer increased, an average area A, a spacing distance C, and an average diameter 'D' of the nanocrystals are increased and a density B thereof is decreased. That is, as the thickness of the nanocrystal layer is increased, an average diameter of the nanocrystals is increased, and thus an average area and a spacing distance of the nanocrystals on the first electrode are increased and a density thereof is decreased An average area, a density, a distance, and an average diameter 'D' of the nanocrystals in accordance with the thickness of the nanocrystal layer are shown in Table 1.

TABLE 1

| Thickness of nanocrystal layer (nm) | Average area (A) | Density (B) | Spacing distance (nm) (C) | Average diameter (nm) (D) |
|---|---|---|---|---|
| 1 | 50 | 1685 | 25 | 7 |
| 2 | 80 | 1886 | 24 | 8 |
| 3 | 174 | 1787 | 21 | 8 |
| 4 | 262 | 1633 | 22 | 13 |
| 5 | 386 | 1091 | 27 | 18 |
| 6 | 867 | 460 | 42 | 28 |
| 7 | 1552 | 235 | 60 | 38 |
| 8 | 1750 | 180 | 68 | 43 |
| 9 | 3099 | 104 | 90 | 57 |
| 10 | 4787 | 92 | 95 | 63 |
| 11 | 4208 | 82 | 101 | 63 |
| 12 | 6516 | 75 | 106 | 77 |
| 13 | 11226 | 49 | 131 | 89 |
| 14 | 13776 | 42 | 142 | 104 |
| 15 | 18361 | 27 | 177 | 154 |

The distance between the nanocrystals is calculated from an equation as shown in Equation 1, in which the average radius r of the nanocrystals is subtracted from the distance L from the center of one nanocrystal to a unit cell, and the resultant value is multiplied by two. Here, the distance L from the center of the one nanocrystal to the unit cell may be expressed as a distance from an end of the unit cell to the center of the nanocrystal when the nanocrystal is assumed to exist in the one unit cell, and the area of the unit cell may be defined as the value of the area of the first electrode on which a plurality of nanocrystals are formed divided by the number of the nanocrystals.

$$\text{Distance between nanocrystals} = 2(L-r) \quad \text{[Equation 1]}$$

Also, as shown in Equation 2, the average area (nm$^2$) of the nanocrystals may be calculated from a value of the sum of the areas of the nanocrystals divided by the number of nanocrystals, and as shown in Equation 3, the density (cm$^{-2}$) of the nanocrystals may be calculated from a value of the number of nanocrystals divided by the total area of the nanocrystals. Also, as shown in Equation 4, the average diameter of the nanocrystals may be calculated from the average area of the nanocrystals.

$$\text{Average area of nanocrystals (nm}^2\text{)} = \frac{\text{Sum of nanocrystal areas}}{\text{Number of nanocrystals}} \quad \text{[Equation 2]}$$

$$\text{Density of nanocrystals (cm}^{-2}\text{)} = \frac{\text{Number of nanocrystals}}{\text{Total area (cm}^{-2}\text{)}} \quad \text{[Equation 3]}$$

$$\text{Average diameter of nanocrystals} = 2 \times \sqrt{\frac{\text{Average area of nanocystals}}{\pi}} \quad \text{[Equation 4]}$$

Figure 8:
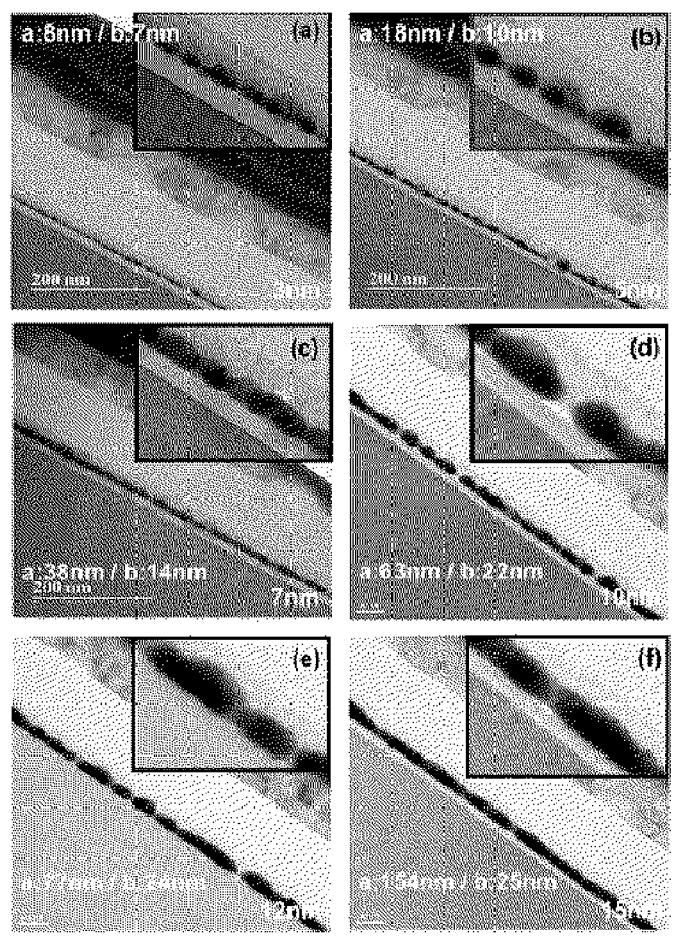
FIG. 8 is an SEM image illustrating a cross-sectional shape of a nanocrystal in accordance with a thickness of a nanocrystal layer.

FIG. 8 is an SEM image illustrating a cross-sectional shape of a nanocrystal in accordance with a thickness of a nanocrystal layer, here, the lengths of the long axis and the short axis of a nanocrystal and the ratio thereof in accordance with the thickness of the nanocrystal are shown in Table 2. FIG. 8 illustrates the length of the long axis and the distance in accordance with the thickness of the nanocrystal layer.

As illustrated in FIG. 8(a), when the nanocrystal layer is formed in a thickness of 3 nm, a nanocrystal is formed to have a long axis and a short axis respectively having lengths of 8 nm and 7 nm, and as illustrated in FIG. 8(b), when the nanocrystal layer is formed in a thickness of 5 nm, a nanocrystal is formed to have a long axis and a short axis respectively having lengths of 18 nm and 10 nm. Also, as illustrated in FIG. 8(c), when the nanocrystal layer is formed in a thickness of 7 nm, a nanocrystal is formed to have a long axis and a short axis respectively having lengths of 38 nm and 14 nm. Also, as illustrated in FIGS. 8(d), 8(e), and 8(f), when the nanocrystal layer is formed in thicknesses of 10 nm, 12 nm, and 15 nm, nanocrystals are formed to have long axes respectively having lengths of 63 nm, 77 nm, and 154 nm and to have short axes respectively having lengths of 22 nm, 24 nm, and 25 nm. Also, a differential aspect ratio of the nanocrystals is shown. The differential aspect ratio may be expressed as a ratio of the average value the radii of short axes to the average value of that of the long axes.

TABLE 2

| Thermal deposition thickness (nm) | Nanocrystal size | | Different aspect ratio (a/b) (diameter/radius) |
|---|---|---|---|
| | Short axis 'b' (nm)/ average (nm) diameter | Long axis 'a' (nm) diameter | |
| 3 | 5-9/7 | 8 | 8/4 |
| 5 | 8-12/10 | 18 | 18/5 |
| 7 | 13-15/14 | 38 | 38/7 |
| 10 | 20-24/22 | 63 | 63/11 |
| 12 | 22-26/24 | 77 | 77/12 |
| 15 | 23-27/25 | 154 | 154/12.5 |

Figure 9:
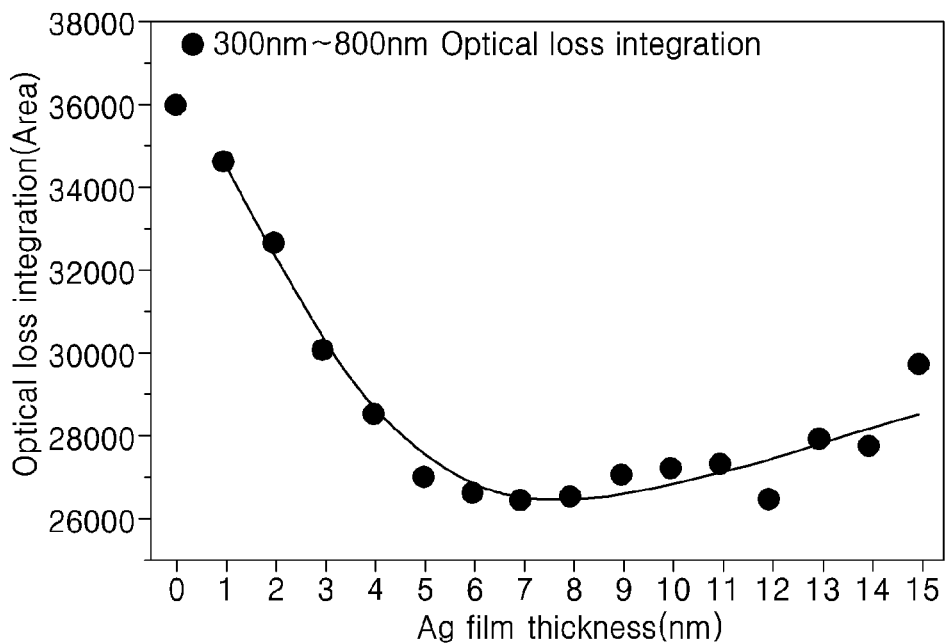
FIG. 9 is a graph illustrating a change in optical loss in accordance with a thickness of a nanocrystal layer.

FIG. 9 is a graph illustrating a change in optical loss in accordance with a thickness of a nanocrystal layer. As illustrated, it can be understood that as the thickness of the nanocrystal layer is increased to 8 nm, optical loss is decreased, and from 9 nm, the optical loss is increased. Especially, the optical loss has a minimum value when the thickness of the nanocrystal layer is 5 nm to 8 nm. Accordingly, it can be understood that when the thickness of the nanocrystal layer is 5 nm to 8 nm, light absorption rate has a maximum value, and thus photoelectric conversion efficiency has the maximum value.

Figure 10:
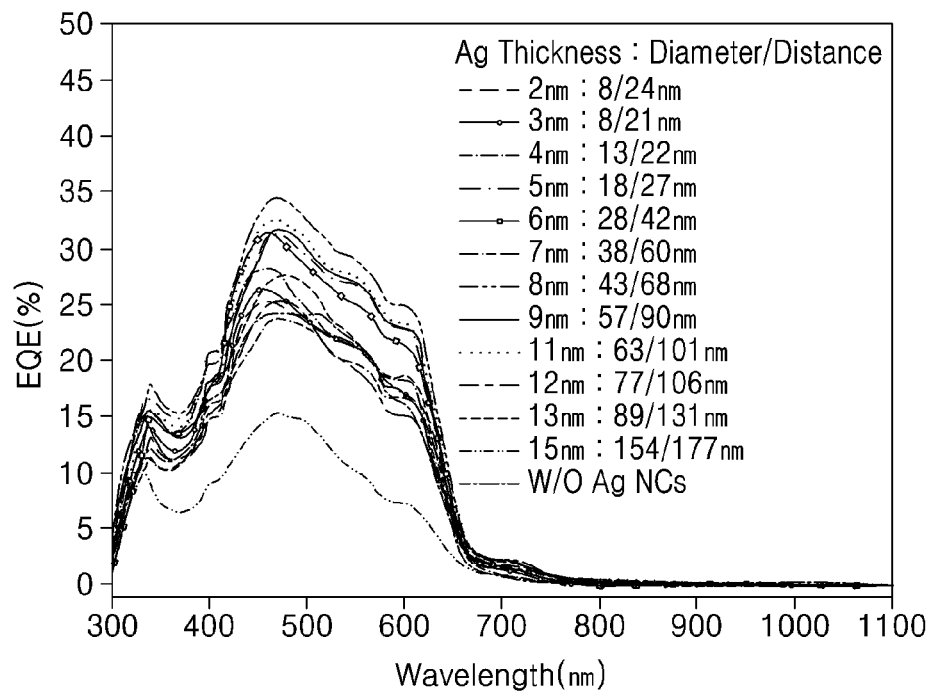
FIG. 10 is a graph illustrating a change in a wavelength and external quantum efficiency in accordance with a thickness of a nanocrystal layer.

FIG. 10 is a graph illustrating a change in external quantum efficiency (EQE) in accordance with a thickness of a nanocrystal layer. As illustrated, when the nanocrystal layer is formed in a thickness of 3 nm to 8 nm, the external quantum efficiency may be improved in comparison with the case in which the nanocrystal layer is not formed. That is, in a typical organic solar cell in which the nanocrystal layer is not formed, external quantum efficiency exhibits a maximum value at the wavelength of 500 nm at which light is most absorbed in the photoactive layer, but when the nanocrystals are formed, external quantum efficiency exhibits a maximum value at the wavelength of 460 nm to 480 nm.

Figure 11:
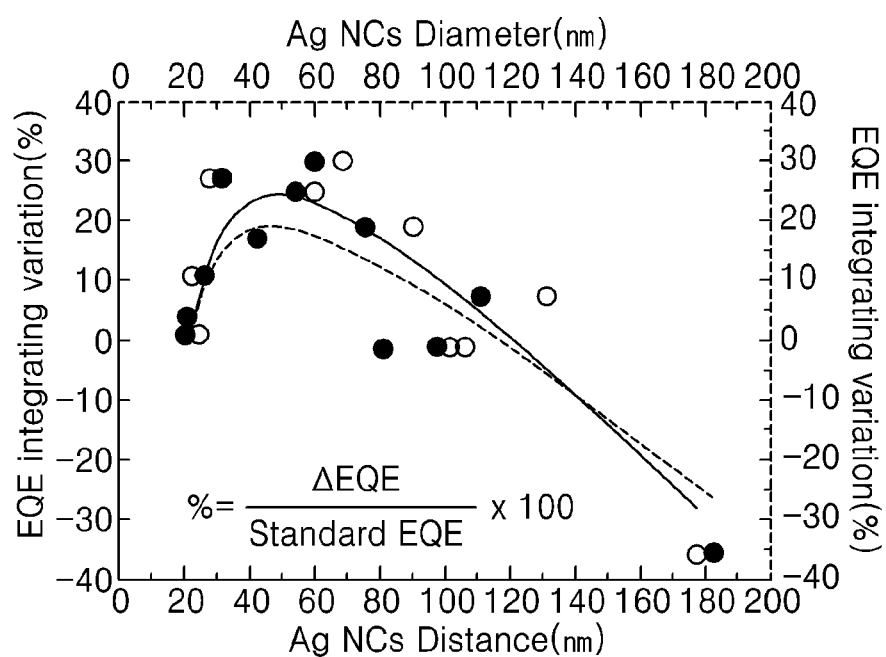
FIG. 11 is a graph illustrating a change in external quantum efficiency in accordance with a thickness of a nanocrystal layer.

Also, FIG. 11 is a graph illustrating an extent of external quantum efficiency in accordance with a size and a distance of a nanocrystal. That is, external quantum efficiency in accordance with the size and the distance of a nanocrystal divided by external quantum efficiency of a solar cell in which nanocrystals are not formed is shown. As illustrated, it can be understood that when the nanocrystal layer is formed in a thickness of 4 nm, 5 nm, 6 nm, 7 nm, and 8 nm, external quantum efficiency is increased by 10%, 30%, 15%, 20%, and 30%. However, when the nanocrystal layer is formed in a thickness of 5 nm or less, and when the nanocrystal layer is formed in a thickness of 11 nm or more, external quantum efficiency is the same as or lower than in the case in which the nanocrystal layer is not formed. Since the density of nanocrystals is high in the case of a thickness of 5 nm or less, external quantum efficiency is lowered due to the increase of reflectance. Also, in the case of a thickness of 9 nm or more, nanocrystals are formed in a shape which does not generate a surface plasmon effect, that is, not in oblate shapes but in dot shapes, and thus external quantum efficiency is lowered due to the increase of reflectance.

Figure 12:
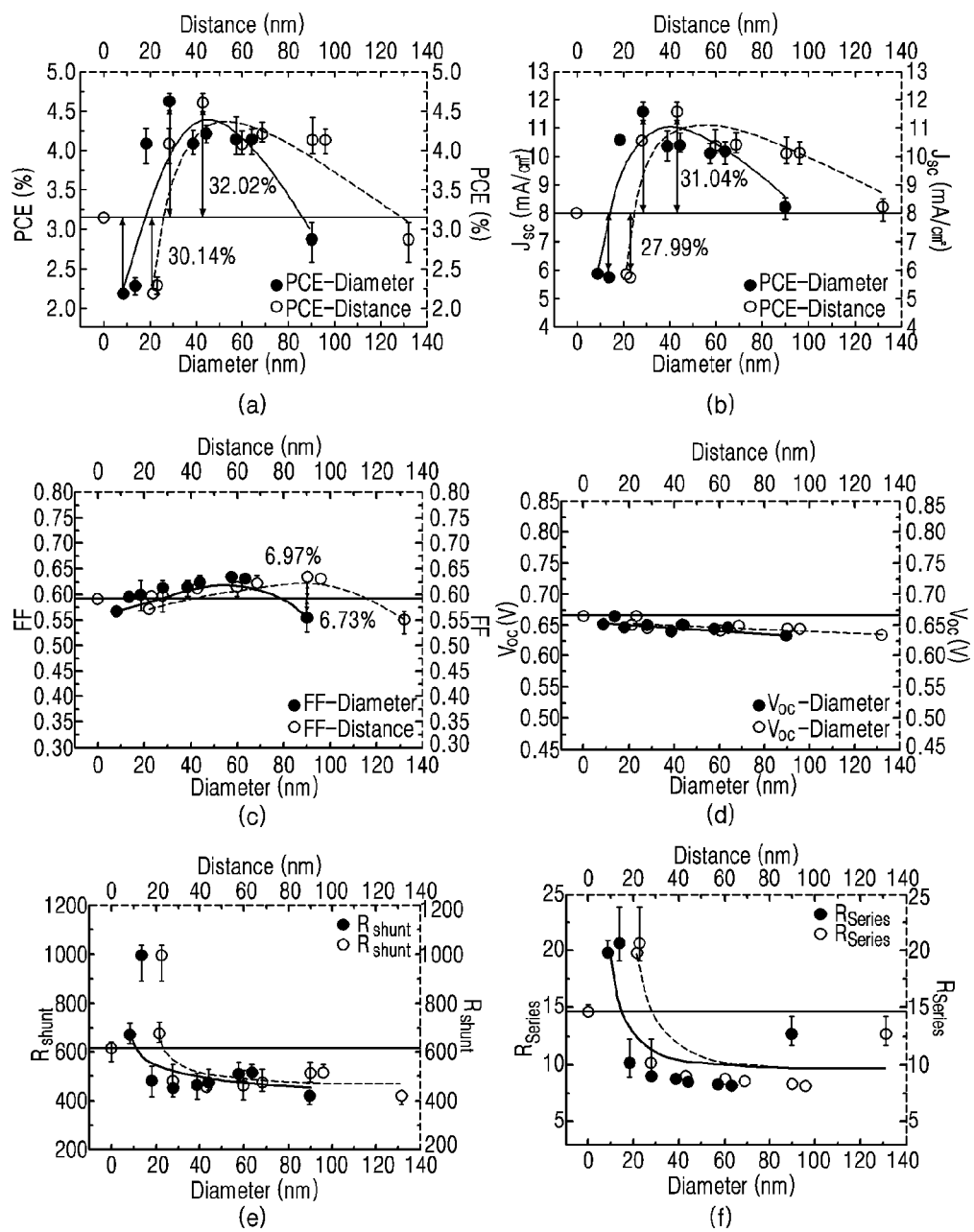
FIG. 12 is a graph illustrating a change in characteristics of an organic solar cell in accordance with a thickness of a nanocrystal layer.

FIG. 12 is a graph illustrating the extents of (a) photoelectric conversion efficiency, (b) current density, (c) filling rate, (d) open voltage, (e) shunt resistance, and (f) series resistance. In accordance with the thickness of the nanocrystal layer, nanocrystals having diameters and shapes different from each other are formed, and the formed nanocrystals generate a surface plasmon phenomenon due to a spacing distance, a density, an area, a diameter, a shape, and a dielectric constant and a refractive index of a material around the nanocrystal. As can be understood from FIG. 12(b), current density characteristic is most increased at a thickness of the nanocrystal layer of 6 nm, and at this time, each nanocrystal has a diameter of 28 nm, and has an oblate shape. Also, the difference in dielectric constant exists between ITO which is the first electrode and PRDOT:PSS which is the hole transport layer. Under this condition, a current density is increased by 31.04%, and as can be understood from FIGS. 12(c) and 12(d), a filling rate and an open voltage are almost not changed. The photoelectric conversion efficiency (PCE) of FIG. 12(a) is increased by 32.02% at 6 nm (diameter of 28 nm/spacing distance of 42 nm), and is increased in comparison with the case, in which nanocrystals are not formed, up to the thickness of the nanocrystal layer of 5 to 10 nm. However, when the thickness of the nanocrystal layer is 3 nm to 4 nm, the current density and the photoelectric conversion efficiency are decreased. From this, it can be understood that the surface plasmon phenomenon occurs only when nanocrystals are formed in optimal diameters, densities and shapes, and this increases the current density of a solar cell and thereby increases efficiency.

As described above, the technical idea of the present invention has been specifically described with respect to the above embodiments, but it should be noted that the foregoing embodiments are provided only for illustration while not limiting the present invention. Various embodiments may be provided to allow those skilled in the art to understand the scope of the present invention.

The invention claimed is:

1. A method for manufacturing a solar cell, comprising:
    forming a first electrode on a substrate, wherein the first electrode is transmissive to light;
    growing each of a plurality of nanocrystals in an island shape in a nanocrystal layer on the first electrode in a maskless deposition, wherein the plurality of nanocrystals are configured to amplify light transmitted through the first electrode;
    performing a plasma smoothing treatment on the first electrode before the forming of the nanocrystal layer, wherein the smoothed surface increases the work function of the first electrode;
    forming a hole transport layer on the first electrode so as to cover the nanocrystals;
    forming a photoactive layer by applying a material, in which electron donors and electron acceptors are mixed, on the hole transport layer, wherein the photoactive layer is partially transmissive to the light; and
    forming a second electrode on the photoactive layer, wherein the second electrode is reflective of the amplified light,
    wherein the plurality of nanocrystals are configured to reflect the amplified light reflected by the second electrode,
    wherein the electron donors absorb the light transmitted through the first electrode and amplified by the plurality of nanocrystals,
    wherein the electron donors absorb the amplified light reflected by the second electrode,
    wherein the electron donors absorb the amplified light reflected by the plurality of nanocrystals that was reflected by the second electrode,
    wherein the second electrode includes reflective material having a work function lower than the material of the first electrode,
    wherein each of the nanocrystals are formed in an ellipse having a long axis with a diameter longer than that of a short axis,
    wherein at least one of the nanocrystals is different from the others in a size of the long axis with the diameter,
    wherein the nanocrystal layer is formed in a thickness of 5 nm to 8 nm,
    wherein the nanocrystals each are in direct contact with the first electrode with a contact distance shorter than the length of the long axis,
    wherein the hole transport layer is formed of at least any one of $MoO_x$, $V_2O_5$, $VO_x$, $WO_3$, $NiO_x$, $Cu_2O$,
    wherein the maskless deposition is a thermal deposition under a vacuum state, and
    wherein the photoactive layer is formed by a process selected from the group consisting of spraying, spin coating, dipping, printing, doctor blading, or sputtering.

2. The method of claim 1, further comprising forming an exciton and hole blocking layer and an electron injection and interface layer between the photoactive layer and the second electrode.

3. The method of claim 1, wherein the nanocrystals have an average spacing distance between adjacent nanocrystals of 25 nm to 75 nm, and wherein the nanocrystals each are formed to have the long axis having a length of 15 nm to 45 nm, and to have the short axis having a length of 8 nm to 17 nm.

* * * * *